United States Patent
Holmgren

(10) Patent No.: US 9,395,545 B2
(45) Date of Patent: Jul. 19, 2016

(54) CUSTOMIZED PUPIL STOP SHAPE FOR CONTROL OF EDGE PROFILE IN LASER ANNEALING SYSTEMS

(71) Applicant: Applied Materials, Inc., Santa Clara, CA (US)

(72) Inventor: Douglas E. Holmgren, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 261 days.

(21) Appl. No.: 14/134,728

(22) Filed: Dec. 19, 2013

(65) Prior Publication Data

US 2014/0268749 A1      Sep. 18, 2014

Related U.S. Application Data

(60) Provisional application No. 61/777,531, filed on Mar. 12, 2013.

(51) Int. Cl.
| | |
|---|---|
| *B23K 26/00* | (2014.01) |
| *B23K 26/02* | (2014.01) |
| *G02B 27/09* | (2006.01) |
| *H01L 21/268* | (2006.01) |

(52) U.S. Cl.
CPC ........ *G02B 27/0988* (2013.01); *G02B 27/0911* (2013.01); *H01L 21/268* (2013.01)

(58) Field of Classification Search
CPC ........... G02B 27/0911; G02B 27/0988; H01L 21/268

USPC .......................................... 219/121.6–121.83
See application file for complete search history.

(56) References Cited

U.S. PATENT DOCUMENTS

| | | | | |
|---|---|---|---|---|
| 5,059,013 | A * | 10/1991 | Jain ..................... | G02B 27/0025 359/503 |
| 5,642,287 | A | 6/1997 | Sotiropoulos et al. | |
| 6,271,909 | B1 | 8/2001 | Suzuki et al. | |
| 6,590,637 | B2 | 7/2003 | Nishi | |
| 7,916,309 | B2 | 3/2011 | Gharib et al. | |
| 7,932,994 | B2 | 4/2011 | Nagasaka | |
| 8,149,423 | B2 | 4/2012 | Sakamoto | |
| 2004/0196881 | A1* | 10/2004 | Toda ..................... | H01S 5/0261 372/43.01 |
| 2006/0237403 | A1* | 10/2006 | Shareef ............... | B23K 26/703 219/121.65 |
| 2009/0071947 | A1* | 3/2009 | Sekiguchi .......... | B23K 26/0617 219/121.75 |
| 2010/0283983 | A1 | 11/2010 | Fukui et al. | |
| 2012/0325784 | A1 | 12/2012 | Moffatt et al. | |

OTHER PUBLICATIONS

International Search Report and Written Opinion for International Application No. PCT/US2013/076175 dated Apr. 8, 2014, whole document.

* cited by examiner

*Primary Examiner* — Sang Y Paik
(74) *Attorney, Agent, or Firm* — Patterson & Sheridan, LLP

(57) ABSTRACT

Embodiments of the invention generally relate to laser annealing systems with optics for imaging a pattern on a substrate. The optics may comprise an aperture or plurality of apertures which shape an image to be exposed on a surface of a substrate. The image may be determined by the shape of an aperture within the optics system.

20 Claims, 3 Drawing Sheets

CUSTOMIZED PUPIL STOP SHAPE FOR CONTROL OF EDGE PROFILE IN LASER ANNEALING SYSTEMS

CROSS-REFERENCE TO RELATED APPLICATIONS

This application claims benefit of U.S. provisional patent application No. 61/777,531, filed Mar. 12, 2013, which is hereby incorporated by reference.

BACKGROUND

1. Field

Embodiments of the invention generally relate to laser annealing systems with optics for imaging a pattern on a substrate. More specifically, embodiments of the invention relate to a customized pupil stop shape for control of edge profile in laser annealing systems.

2. Description of the Related Art

Thermal processing is commonly practiced in the semiconductor industry. Semiconductor substrates are subjected to thermal processing in the context of many transformations, including doping, activation, and annealing of gate, source, drain, and channel structures, siliciding, crystallization, oxidation, and the like. Techniques of thermal processing have progressed from simple furnace baking to various forms of increasingly rapid thermal processing such as RTP, spike annealing, and laser annealing.

Conventional laser annealing processes use laser emitters that may be semiconductor or solid state lasers with optics that focus, defocus, or variously image the laser light into a desired shape. A common approach is to image the laser light into a line or thin rectangular image. The laser light is scanned across a substrate (or the substrate is moved beneath the laser light) to process the surface of the substrate.

It is well known that the image produced with coherent light exhibits sharp definition, but also includes a pronounced overshoot, or "ringing" effect, characterized by high intensity non-uniformities near the edge of the image, while the same image produced with incoherent light exhibits less definition, characterized by a soft shoulder and somewhat broadened roll-off width, but also exhibits less overshoot. In the case of partially coherent light, the image produced has a reduced ringing effect when compared to an image produced with fully coherent light which exhibits a more narrow roll-off than an image produced with fully incoherent light. The ringing effect and roll-off may be affected by the use of an aperture in the laser optics system. However, current apertures generally do not provide desired results with respect to overshoot and roll-off.

Accordingly, there is a need in the art for improved apertures in laser annealing systems.

SUMMARY

Embodiments of the invention generally relate to laser annealing systems with optics for providing an image on a substrate. The optics may comprise an aperture or plurality of apertures which shape an image to be exposed on a surface of a substrate. The image may be determined by the shape of an aperture within the optics system.

One embodiment provides an apparatus for use in an optical system. The apparatus comprises a light source adapted to provide illumination having a first numerical aperture, a first aperture illuminated by the light source and adapted to form an image, and a second aperture disposed downstream from the first aperture. The apparatus further comprises a relay optic comprising a second numerical aperture defined by the second aperture, wherein the second aperture is adapted to match a ratio of the first numerical aperture at the first aperture to the second numerical aperture of the relay optic in a plane in a first direction and a second direction perpendicular to the first direction.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to laser annealing systems with optics for imaging a pattern on a substrate. The optics may comprise an aperture or plurality of apertures which shape an image to be exposed on a surface of a substrate. The image may be determined by the shape of an aperture within the optics system.

Figure 1:
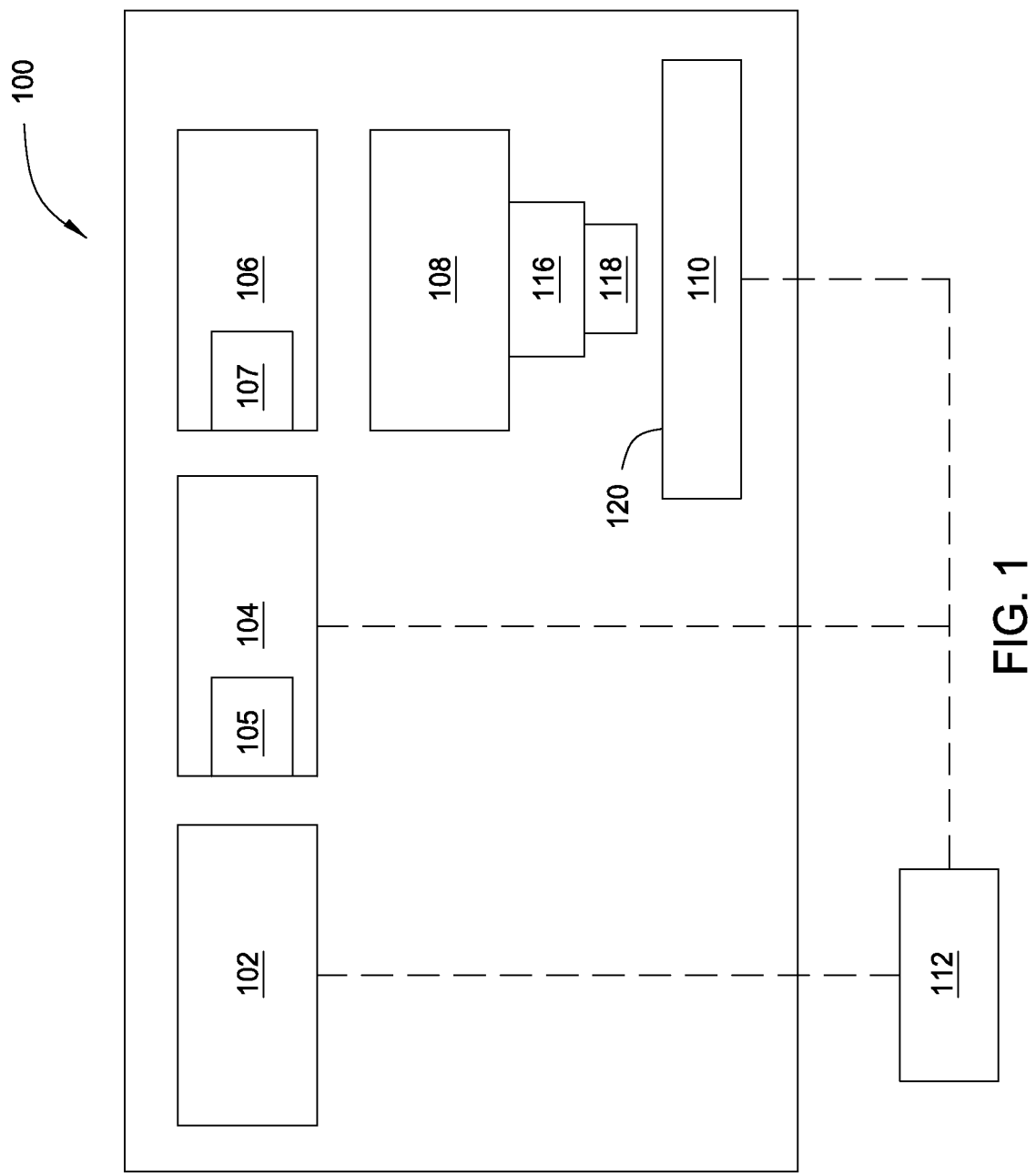
FIG. 1 is a schematic diagram of a thermal processing apparatus according to certain embodiments.

FIG. 1 is a plan view of a system 100 for laser processing of substrates. The system 100 comprises an energy module 102 that has a plurality of pulsed laser sources producing a plurality of laser pulses and a pulse control module 104 that combines individual laser pulses into combination laser pulses. The pulse control module 104 controls the intensity, frequency characteristics, and polarization characteristics of the combination laser pulses. The system 100 also comprises a pulse shaping module 106 that adjusts the temporal profile of the combination laser pulses and a homogenizer 108 that adjusts the spatial energy distribution of the pulses by overlapping the combination laser pulses into a single uniform field. In one embodiment, the light produced by the homogenizer 108 comprises two laser beams providing a uniform field.

The system 100 further comprises an aperture member 116 that removes residual edge non-uniformity from the single uniform field, and relay optics 118 that allow for precision alignment of the laser energy field with a substrate disposed on a substrate support 110. A controller 112 is coupled to the energy module 102 to control production of the laser pulses, the pulse control module 104 to control pulse characteristics, and the substrate support 110 to control movement of the substrate with respect to the energy field. An enclosure system 114 typically encloses the operative components of the system 100.

The lasers may be any type of laser capable of forming short pulses, for example durations less than about 100 nsec, of high power laser radiation. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example, $XeCl_2$, ArF, or KrF lasers, may be used.

The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 100 mJ and about 1 J, with duration between about 1 nsec and about 100 psec, typically about 1 J in about 8 nsec. The lasers may have wavelengths between about 200 nm and about 2,000 nm, such as between about 400 nm and about 1,000 nm, for example about 532 nm. In one embodiment, the lasers are q-switched frequency-doubled Nd:YAG lasers. The lasers may all operate at the same wavelength, or one or more of the lasers may operate at different wavelengths from the other lasers in the energy module 102. The lasers may be amplified to develop the power levels desired. In one or more embodiments, the amplification medium is the same or similar composition to the lasing medium. Each laser pulse is usually amplified by itself, but in certain embodiments, all laser pulses may be amplified after combination.

A typical laser pulse delivered to a substrate may be a combination of multiple laser pulses. The multiple pulses are generated at a controlled time and in a controlled relationship with one another such that, when combined, a single pulse of laser radiation results that has a controlled temporal and spatial energy profile, controlled energy rise, duration, decay, and a controlled spatial distribution of energy non-uniformity. The controller 112 may have a pulse generator, for example an electronic timer coupled to a voltage source, that is coupled to each laser, for example each switch of each laser, to control generation of pulses from each laser.

Figure 2:
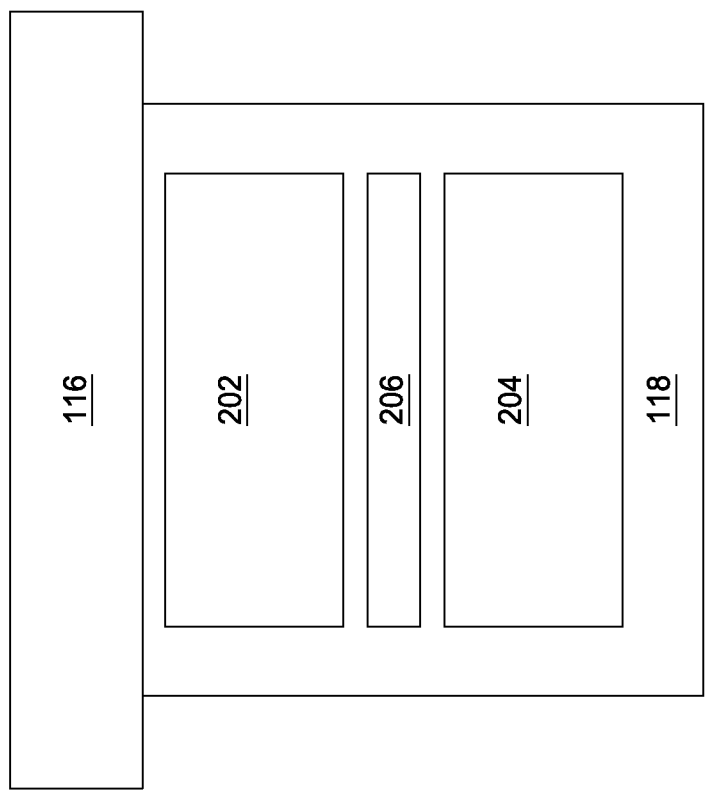
FIG. 2 is a schematic diagram of optical elements in the thermal processing apparatus of FIG. 1 according to certain embodiments.

FIG. 2 is a partial schematic diagram of optical elements in the thermal processing apparatus of FIG. 1. The optical elements depicted in FIG. 2 include an aperture member 116, such as described above, and relay optics 118. The aperture member 116, such as a projection aperture, is generally positioned upstream of the relay optics 118 in the system 100. Thus, light must pass through an opening (or aperture) in the aperture member 116 before the light passes through the relay optics 118. Generally, the aperture member 116 functions as a beam shaping aperture which truncates light from one or more laser beams which originated upstream of the aperture member 116. In one embodiment, the aperture member 116 may be substantially rectangular. It should be noted that the optical system described herein may operate at a magnification of 1×, however other magnifications are also contemplated. Thus, an image at the aperture member 116 is the same "size" when the image is at a substrate's surface.

The relay optics 118 comprise a first relay optic 202, a second relay optic 204, and a relay aperture 206, such as a pupil stop. The first relay optic 202 may comprise one or a plurality of lenses selected to transmit an image in a desired manner. The first relay optic 202 is disposed between aperture member 116 and the relay aperture 206. The second relay optic 204 may comprise one or a plurality of lenses selected to transmit an image in a desired manner. The second relay optic 204 is disposed between the relay aperture 206 and a substrate support (not shown).

Figure 3:
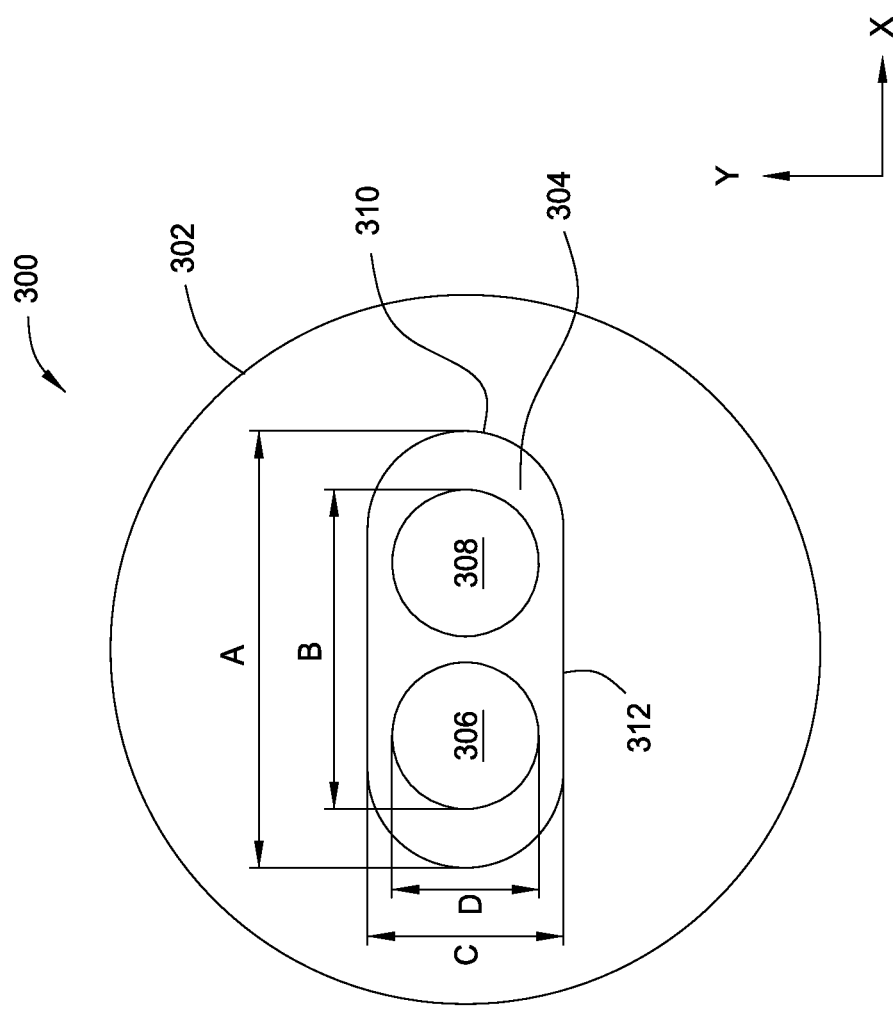
FIG. 3 is a plan view of a relay aperture apparatus according to certain embodiments.

FIG. 3 is a plan view of a relay aperture 300 according to certain embodiments. The relay aperture 206 may be the relay aperture 300. As light from the system 100 is provided to the aperture member 116, some amount of light will be truncated by the aperture member 116 and prevented from entering the relay optics 118 and the relay aperture 300. The ultimate goal of the imaging optics 118 is to image the aperture member 116 on a surface of the substrate.

The relay aperture 300 reduces overshoot, or "ringing," associated with the coherency of light and sets the resolution of the image at the substrate surface. In one embodiment, the relay aperture is selected to provide edge roll-off less than about 5 μm. In this context, edge roll-off is defined as the distance over which the image intensity drops 90% from the nominal edge intensity.

In certain embodiments using multiple laser sources, multiple angles θ of incident laser light illuminate the aperture member 116. It is common to refer to the angle θ as the illumination numerical aperture ($NA_i$). The $NA_i$ is given by the expression $NA_i=Sin(θ)$. With multiple light sources, there is a distribution in the angles of light at the aperture member 116 which results in an increase in the spatial extent of the light at the relay aperture 300. As the $NA_i$ becomes numerically equal to the relay numerical aperture ($NA_{relay}$), the spatial extent of the light fills the relay aperture 300.

As known in the field of microscopy, the ratio of $NA_i$ to $NA_{relay}$ is a measure of the degree of spatial coherence of the object illumination (in this embodiment, the object is the aperture member 116). In the field of photolithography, the ratio of numerical apertures is commonly referred to as $σ=NA_i/NA_{relay}$. When $σ<<1$, the spatial extent of light in the relay aperture 300 is small compared to relay aperture 300 size. The spatial coherence of illumination is very high and coherent effects, such as strong overshoot and small edge roll-off, are present in the final image formed by the relay optics 118. When $σ≥1$, the spatial coherence of illumination is very low and the light fully fills the relay aperture 300. The final image exhibits negligible overshoot but larger edge roll-off.

In one embodiment, the σ in the X axis at the aperture member=0.75 while the σ in the Y axis at the aperture member=0.75. In one embodiment, the geometry of the relay aperture 300 is selected to closely match the σ in both the X and Y axis of the aperture member 300. As such, one embodiment provides for matching the σ in the X direction and Y direction of an XY plane. The image resolution and associate edge roll-off is balanced with the amount of overshoot present and the associated aperture size. Matching of the σ and balancing resolution and overshoot may be achieved by tailoring the geometry of the relay aperture 300.

The relay aperture 300 comprises a body 302, a first edge 310, second edge 312, and an opening 304. In one embodiment, the body 302 comprises aluminum, however it is contemplated that other suitable materials, such as mask or non-transparent materials, may be used to form the body 302 of the relay aperture 300. The body 302 also comprises a substantially circular circumference at the perimeter of the body 302. In one embodiment, the second edge 312 is substantially linear as shown in FIG. 3 oriented along the X axis and the first edge 310 is curved. The combination of two second edges 312 and two first edges 310 form an oblong, or "racetrack" type opening 304. The opening 304 is substantially symmetric along both the X axis and the Y axis. The first edge 312 and second edge 310 are formed in the body and are typically sharp, beveled edges.

The opening 304 is disposed at a center region of the body 302. The opening 304 extends a distance A along the X axis between a center region on each of the curved edges 310. In one embodiment, distance A is between about 30 mm and about 50 mm, such as between about 35 mm and about 40 mm, for example, about 37 mm. The opening 304 extends a distance C along the Y axis between each of the linear edges 312. In one embodiment, distance C is between about 5 mm and about 25 mm, such as between about 10 mm and 20 mm, for example, about 15 mm.

Light imaged by the relay aperture 300 is provided by one or more laser beams. In one embodiment, a first laser beam 306 and a second laser beam 308 are provided. In a relay aperture such as the relay aperture 300, the opening 304 encompasses the laser beams 306 and 308 and does not truncate light propagating through the relay aperture 300. The opening 304 may accommodate one or more laser beams which may have a substantially circular cross section. The laser beams 306 and 308 may be identical. A diameter D of a laser beam 306 or 308 may be between about 5 mm and 20 mm, such as between about 10 mm and 15 mm, for example, about 11 mm. The distance B between an outermost edge of beam 306 and an outermost edge of beam 308 may be between about 20 mm and 35 mm, such as between about 25 mm and 30 mm, for example, about 27 mm.

It is contemplated that various sizes and shapes of the opening of the relay aperture may be used to account for different light sources. For example, four laser beams may be provided and a substantially square opening may be provided to match the σ values.

The geometry of the opening 304 is selected to balance overshoot and edge roll-off of the image at the substrate surface. The geometry of the opening 304 reduces the area that is not filled with light, which reduces the overshoot observed in the image. The relay aperture 300 is formed to provide a shape that matches the geometry of the laser beam image in the opening 304 so that the value of σ does not change significantly with direction in the x-y plane. The result is an imaging system for which overshoot is approximately independent of a given edge's direction at the image plane. The image resolution (edge roll-off width) will vary with the direction in the image (x-y) plane ($NA_{relay}$ varies with direction in the x-y plane). In certain embodiments, such as laser annealing applications, varying image resolution may be preferable to having excessive overshoot for some edges.

While the foregoing is directed to embodiments of the present invention, other and further embodiments of the invention may be devised without departing from the basic scope thereof, and the scope thereof is determined by the claims that follow.

The invention claimed is:

1. An apparatus for use in an optical system, comprising:
a light source adapted to provide illumination having a first numerical aperture;
a first aperture member having a first aperture illuminated by the light source and adapted to form an image;
a second aperture member having a second aperture disposed downstream from the first aperture; and
a relay optic having a second numerical aperture defined by the second aperture, wherein a geometry of the second aperture has a dimension in a first direction adapted to match a ratio of the first numerical aperture at the first aperture to the second numerical aperture of the relay optic and wherein the geometry of the second aperture has a dimension in a second direction perpendicular to the first direction adapted to match the ratio of the first numerical aperture at the first aperture to the second numerical aperture of the relay optic.

2. The apparatus of claim 1, wherein the light source comprises a plurality of laser beams.

3. The apparatus of claim 2, where the plurality of laser beams comprises a bi-polar laser source.

4. The apparatus of claim 1, wherein the first aperture member truncates at least a portion of light from the light source.

5. The apparatus of claim 4, wherein the second aperture is anamorphic.

6. The apparatus of claim 1, wherein the image formed by the first aperture is substantially rectangular.

7. The apparatus of claim 1, wherein the second aperture member is a relay aperture.

8. The apparatus of claim 1, wherein the second aperture member comprises a body having an opening.

9. The apparatus of claim 8, wherein the body comprises an aluminum material or a ceramic material.

10. The apparatus of claim 9, wherein the opening has a sharp, beveled edge.

11. The apparatus of claim 8, wherein the opening is an oblong opening.

12. The apparatus of claim 11, wherein the oblong opening has a plurality of linear edges and a plurality of curved edges.

13. The apparatus of claim 12, wherein a distance between the plurality of linear edges is about 15 mm.

14. The apparatus of claim 12, wherein a distance between the plurality of curved edges is about 37 mm.

15. The apparatus of claim 1, wherein the image is formed at a 1× magnification.

16. The apparatus of claim 8, wherein the opening is selected to reduce an overshoot of the image.

17. The apparatus of claim 16, wherein the opening is selected to increase a resolution of the image.

18. The apparatus of claim 17, wherein the opening is selected to reduce an edge roll-off of the image.

19. The apparatus of claim 18, wherein the edge roll-off is less than about 5μm.

20. The apparatus of claim 1, wherein a substrate is disposed downstream from the second aperture.

* * * * *